(12) United States Patent
Fukusho

(10) Patent No.: US 6,569,703 B1
(45) Date of Patent: May 27, 2003

(54) METHOD OF MANUFACTURING SOLID-STATE IMAGE SENSING DEVICE

(75) Inventor: Takashi Fukusho, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/116,120

(22) Filed: Jul. 16, 1998

(30) Foreign Application Priority Data

Jul. 16, 1997 (JP) .............................. 9-190820
Sep. 19, 1997 (JP) .............................. 9-254548

(51) Int. Cl.⁷ ........................ H01L 21/00; H01L 27/14
(52) U.S. Cl. ......................... 438/60; 438/75; 257/215
(58) Field of Search ........................ 438/75, 60, 78; 257/215

(56) References Cited

U.S. PATENT DOCUMENTS

| | | | | |
|---|---|---|---|---|
| 5,514,887 A | * | 5/1996 | Hokari | 257/222 |
| 5,576,239 A | * | 11/1996 | Hatano et al. | |
| 5,736,756 A | * | 4/1998 | Wakayama et al. | 438/223 |
| 6,060,732 A | * | 5/2000 | Murakami et al. | 257/215 |
| 6,066,511 A | * | 5/2000 | Fukusyo | 438/60 |
| 6,090,640 A | * | 7/2000 | Ogawa | 438/78 |

* cited by examiner

*Primary Examiner*—Mary Wilczewski
(74) *Attorney, Agent, or Firm*—Sonnenschein, Nath & Rosenthal

(57) ABSTRACT

A method of manufacturing a solid-state image sensing device in which a light-sensitive sensor part for photoelectric transfer is formed on the surface of a substrate and a light shielding film for preventing light from being incident on the substrate except the light-sensitive sensor part is formed is provided. First, a transfer electrode is formed on the substrate via an insulating film and after an interlayer insulating film for covering the transfer electrode is further formed, a planarized film for covering the interlayer insulating film is formed. Next, only the location of the planarized film to be a light shielding area for forming a light shielding film is selectively etched, a concave portion is formed and a groove deep enough to reach the vicinity of the surface of the substrate is formed by etching the planarized film over the periphery of the light-sensitive sensor part and near the side of the transfer electrode. Afterward, the material of a light shielding film is embedded in the concave portion and inside the groove and a light shielding film is formed. The provision of the solid-state image sensing device and the manufacturing method in which the efficiency of condensing beams to the light-sensitive sensor part is enhanced and the sensitivity is enhanced is thus desired.

6 Claims, 3 Drawing Sheets

METHOD OF MANUFACTURING SOLID-STATE IMAGE SENSING DEVICE

BACKGROUND OF THE INVENTION

1. Field of the Invention

The present invention relates to a method of manufacturing a solid-state image sensing device provided with a light shielding film and a solid-state image sensing device in which the efficiency of condensing beams to a light-sensitive sensor is enhanced.

2. Description of the Related Art

A solid-state image sensing device which represents a charge coupled device (CCD) is a device for photographing an image formed by light and others, a light-sensitive sensor part for photoelectric transfer is formed on the surface of a substrate such as a silicon substrate and a light shielding film for preventing light from being incident on the substrate except the above light-sensitive sensor is formed.

In such a solid-state image sensing device, a metal sputtered film is normally used for a light shielding film. That is, heretofore, a metal film, particularly an aluminum film is formed by sputtering, patterned by dry etching using a photoresist mask, a part over a light-sensitive sensor part is open and a light shielding film is formed on a part except the light-sensitive sensor.

Recently, the miniaturization of a solid-state image sensing device and the densification of a picture element are more accelerated, hereby, the area of a light-sensitive sensor part is reduced and the deterioration of characteristics such as the deterioration of sensitivity and the increase of a smear is caused.

For measures for the deterioration of sensitivity, measures such as an on-chip lens is provided and the efficiency of condensing beams to a light-sensitive sensor is enhanced are proposed and executed.

For measures for a smear, normally, measures such as a light shielding film is formed with the film extended even over a light-sensitive sensor part are taken.

However, as the difference in a level of a transfer electrode and others is relatively increased because of miniaturization and the densification of a picture element even in a solid-state image sensing device in which the above on-chip lens is provided and the efficiency of condensing beams is enhanced, the degree of the covering of a light shielding film formed by sputtering aluminum is not enough and particularly, if a substrate has large difference in a level, the degree of sufficient covering is sometimes not realized. When the degree of covering becomes insufficient because of the densification of a picture element as described above and a light shielding function cannot be sufficiently achieved, a component which transmits light to a transfer electrode is increased and characteristics against a smear are deteriorated.

As a picture element is densified, difference in a level in a light-sensitive sensor part is increased, hereby, uniformity in working an opening is deteriorated, the degree of covering is further deteriorated, the minute nonuniformity of sensitivity is caused and characteristics as a image sensing device are deteriorated. Further, a clamping error may be caused by the transmission of an optical black beam.

As for a solid-state image sensing device in which a light shielding film is extended up to over a light-sensitive sensor part, when a light shielding film is extended as described above, the area of an opening over the light-sensitive sensor part is naturally reduced, the efficiency of condensing beams is deteriorated, sensitivity is deteriorated after all and the above miniaturization and the densification of a picture element cannot be realized.

SUMMARY OF THE INVENTION

The present invention is made in view of the above conditions and the object is to provide a solid-state image sensing device in which the efficiency of condensing beams to a light-sensitive sensor and sensitivity are enhanced and its manufacturing method.

To solve the above problems, a method of manufacturing a solid-state image sensing device according to the present invention and disclosed in claim 1 wherein a light-sensitive sensor part for photoelectric transfer is formed on the surface of a substrate and a light shielding film for preventing light from being incident on the substrate except the above light-sensitive sensor part is formed is provided with a process for forming a transfer electrode on the substrate via an insulating film and forming a planarized film for covering an interlayer insulating film after the interlayer insulating film for covering the transfer electrode is further formed, a process for selectively etching only the location of the planarized film to be a light shielding area for forming the above light shielding film and forming a concave portion, a process for forming a groove deep enough to reach the vicinity of the surface of the substrate by etching the planarized film over the periphery of the above light-sensitive sensor part and near the side of the transfer electrode and a process for forming the light shielding film by burying the material of the light shielding film in the concave portion and inside the groove.

According to the above manufacturing method, as the concave portion is formed in only the location of the planarized film to be the light shielding area, the groove deep enough to reach the vicinity of the surface of the substrate is formed over the periphery of the light-sensitive sensor part and near the side of the transfer electrode and afterward, the light shielding film is formed by burying the material of the light shielding film in the concave portion and inside the groove, the light shielding film without an extended part is formed, hereby, the efficiency of condensing beams to the light-sensitive sensor part is enhanced and sensitivity is enhanced.

To solve the above problems, a method of manufacturing a solid-state image sensing device wherein a light-sensitive sensor part for photoelectric transfer is formed on the surface of a substrate and a light shielding film for preventing light from being incident on the substrate except the above light-sensitive sensor part is formed is provided with a process for forming a transfer electrode on the substrate via an insulating film and forming a first planarized film for covering an interlayer insulating film after the interlayer insulating film for covering the transfer electrode is further formed, a process for forming a groove deep enough to reach the vicinity of the surface of the substrate by etching the first planarized film over the periphery of the above light sensitive sensor part and near the side of the transfer electrode, a process for forming a first light shielding film by burying the material of the light shielding film inside the groove, a process for forming a second planarized film for covering the first planarized film on the first planarized film, a process for forming a concave portion with the upper surface of the first light shielding film opposite to the outside by selectively etching only the location of the second planarized film to be a light shielding area for forming the light shielding film and a process for forming a second light shielding film by burying the material of the light shielding film inside the concave portion and hereby, acquiring a light shielding film made of the first and second light shielding films.

According to the above manufacturing method, as a groove deep enough to reach the vicinity of the surface of a substrate is formed in a first planarized film over the periphery of a light-sensitive sensor part and near the side of a transfer electrode, a first light shielding film is formed by burying the material of the light shielding film inside the groove, next, a concave portion is formed in only the location of a second planarized film to a light shielding area, afterward, a second light shielding film is formed by burying the material of the light shielding film inside the concave portion and hereby, a light shielding film made of the first and second light shielding films is acquired, particularly, a light shielding film without a protruded part is formed by the first light shielding film embedded inside the groove, hereby, the efficiency of condensing beams to the light-sensitive sensor part is enhanced and sensitivity is enhanced.

To solve the above problems, a method of manufacturing a solid-state image sensing device wherein a light-sensitive sensor part for photoelectric transfer is formed on the surface of a substrate and a light shielding film for preventing light from being incident on the substrate except the above light-sensitive sensor part is formed is provided with a process for forming a transfer electrode on the substrate via an insulating film and forming a planarized film for covering an interlayer insulating film after the interlayer insulating film for covering the transfer electrode is further formed, a process for forming a groove deep enough to reach the vicinity of the surface of the substrate by etching the planarized film over the periphery of the light-sensitive sensor part and near the side of the transfer electrode, a process for forming a first light shielding film by burying the material of the light shielding film inside the groove, a process for forming a light shielding film with the film connected to the first light shielding film embedded inside the groove and a process for patterning the above light shielding film, forming a second light shielding film with an opening in a part surrounded by the upper ends of the first light shielding film and hereby, acquiring a light shielding film made of the first and second light shielding films.

According to the above manufacturing method, as a groove deep enough to reach the vicinity of the surface of a substrate is formed in a planarized film over the periphery of a light-sensitive sensor part and near the side of a transfer electrode, a first light shielding film is formed by burying the material of the light shielding film inside the groove, next, a light shielding film is formed with the film connected to the first light shielding film and is further patterned, a second light shielding film with an opening in a part surrounded by the upper ends of the first light shielding film is formed and hereby, a light shielding film made of the first and second light shielding films is acquired, particularly, a light shielding film without a protruded part is formed by the first light shielding film embedded inside the groove, hereby, the efficiency of condensing beams to the light-sensitive sensor part is enhanced and sensitivity is enhanced.

To solve the above problems, a solid-state image sensing device disclosed in claim 19 wherein a light-sensitive sensor part for photoelectric transfer is formed on the surface of a substrate and a light shielding film for preventing light from being incident on the substrate except the above light-sensitive sensor part is formed is characterized in that the above light shielding film is made of a first light shielding film formed over the periphery of a light-sensitive sensor part and near the side of a transfer electrode for covering the side of the transfer electrode and a second light shielding film formed for covering the respective upper surfaces of the transfer electrode and the first light shielding film and formed with the ends of the second light shielding film extended over the light-sensitive sensor part.

According to the above solid-state image sensing device, as the light shielding film is made of the first light shielding film formed over the periphery of the light-sensitive sensor part and near the side of the transfer electrode for covering the side of the transfer electrode and the second light shielding film farmed for covering the respective upper surfaces of the transfer electrode and the first light shielding film and formed with the ends of the second light shielding film extended over the light-sensitive sensor part, particularly, a light shielding film without a protruded part is formed on the side of the surface of the substrate by the first light shielding film embedded inside the groove, hereby, the area of an opening over the light-sensitive sensor part is increased and the efficiency of condensing beams is enhanced. Light reflected on the light-sensitive sensor part is reflected on the extended part again, is incident on the light-sensitive sensor part by providing a part extended over the light-sensitive sensor part to the second light shielding film and hereby, the efficiency of condensing beams is more enhanced.

DESCRIPTION OF THE PREFERRED EMBODIMENTS

The present invention will be described in detail below.

FIGS. 1A to 1F are explanatory drawings for explaining an embodiment of a method of manufacturing a solid-state image sensing device disclosed in claim 1 according to the present invention in the order of processes and a reference number 1 in FIGS. 1A to 1F denotes a silicon substrate.

Figure 1A:
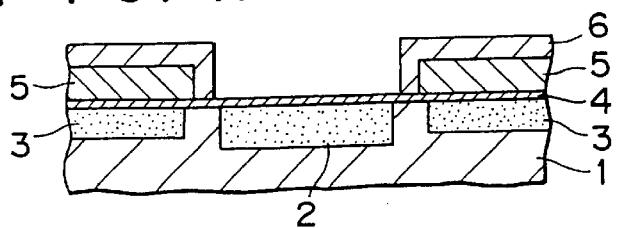
FIGS. 1A to 1F are side sectional views showing the main part for explaining an embodiment of a method of manufacturing a solid-state image sensing device according to the present invention.

In this example, first, a light-sensitive sensor part 2, a charge transfer part 3, a channel stop not shown and a reading section not shown are formed on the surface of the silicon substrate 1 as shown in FIG. 1A as in the prior art, an insulating film 4 is formed on the surface of the silicon substrate 1 and further, a transfer electrode 5 and an interlayer insulating film 6 are formed on the insulating film 4.

Concretely, first, impurities are doped into the silicon substrate 1 by ion implantation and others, further, are diffused and the charge transfer part 3, the channel stop not shown and the reading section not shown are formed. Next, the insulating film 4 with ONO structure composed of a laminated film of a silicon oxide film, a silicon nitride film and a silicon oxide film is formed on the surface of the silicon substrate 1 by thermal oxidation and chemical vapor deposition (CVD). The insulating film 4 may be also composed of only a silicon oxide film instead of ONO structure, however, in that case, it is desirable that a silicon nitride film which functions as an etching stopper in etching a groove described later is formed on the silicon oxide film.

Next, a polysilicon film is formed by CVD, further, the polysilicon film not shown is patterned using well-known resist technique, lithography and etching technique and the transfer electrode 5 is formed. Next, impurities are doped by ion implantation and others using the formed transfer electrode 5 as a mask, further, are diffused and the light-sensitive sensor part 2 is formed by self-aligning. The light-sensitive sensor part 2 may be also formed before, after or simultaneously when the above charge transfer part 3, the channel stop and the reading section are formed.

Next, the interlayer insulating film 6 composed of $SiO_2$ and others is formed by HTO, vacuum CVD using TEOS as material and others so that the interlayer insulating film covers the transfer electrode 5. As for the formation of the transfer electrode 4, if the transfer electrode is composed of two layers, the above process is repeated twice and if the transfer electrode is composed of three or more layers, the above process is repeated by the number of the layers.

Figure 1B:
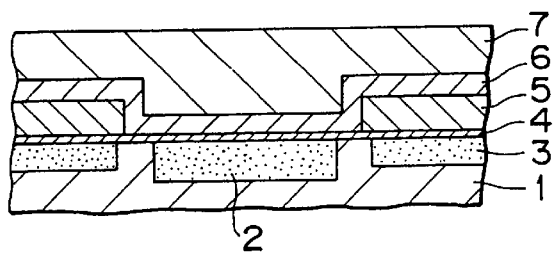

When the transfer electrode 5 and the interlayer insulating film 6 are formed on the silicon substrate 1 as described above, a planarized film 7 is formed with the film covering them as shown in FIG. 1B. As for the planarized film 7, an SiN film, an SiO film which flatten for itself by high density plasma CVD or an $O_3$-TEOS CVD film, a BPSG CVD film, an SOG film and others are used and these are formed to be the planarized film 7 provided with sufficient flatness by reflowing and others.

Figure 1C:
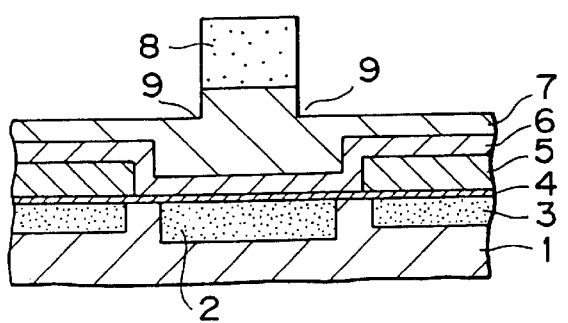

Next, the planarized film 7 is patterned using a resist pattern 8 as a mask as shown in FIG. 1C and well-known resist technique, lithography and etching technique, only the location to be a light shielding area for forming a light shielding film is selectively etched and a concave portion 9 is formed.

Figure 1D:
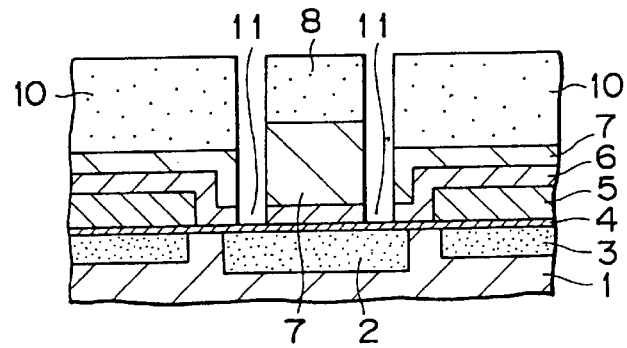
Figure 1E:
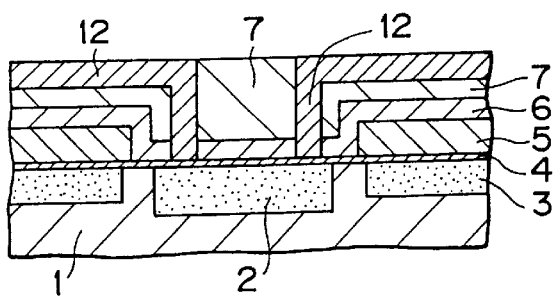

Next, as shown in FIG. 1D, the planarized film 7 is patterned again using the resist pattern 8 and a newly formed resist pattern 10 as a mask or using a newly formed resist pattern after the resist pattern 8 is removed as a mask, the planarized film over the periphery of the light-sensitive sensor part 2 and near the side of the transfer electrode 5 is etched and a groove 11 deep enough to reach the surface of the silicon substrate 1 is formed. The precision of superposition of the resist pattern 10 has only to be in a range in which the width of the groove 11 shown in FIG. 1D is secured.

In etching for forming the groove 11, if the planarized film 7 is made of SiO, the silicon nitride film in the insulating film 4 with ONO structure as described above functions as an etching stopper and if the planarized film 7 is made of SiN, the silicon oxide film in the above insulating film 4 functions as an etching stopper. Therefore, the groove 11 can be precisely formed by making the insulating film 4 function as an etching stopper as described above so that the groove is deep enough to approximately reach the surface of the silicon substrate 1.

When the concave portion 9 and the groove 11 are formed as described above, the above resist patterns 8 and 10 are removed and afterward, the material of a light shielding film is embedded in the concave portion 9 and inside the groove 11. Chemimechanical polishing (CMP) or etchback is applied to the material of the light shielding film embedded as described above, as shown in FIG. 1E, the material of the light shielding film in an area for receiving light over the light-sensitive sensor part 2 is selectively removed and a light shielding film 12 is formed. As for the material of a light shielding film, metallic materials which can reflow, concretely metallic materials provided with the property of covering with large difference in a level such as Al (or an alloy or a compound of Al and Si and others), W (or its alloy or its compound) and Cu (or an alloy or a compound of Cu and Si and others) are suitably used. The material of the light shielding film is embedded by CVD by which the material can be easily embedded and which is excellent in covering power by self-reflowing. If self-reflowing is not enough, reflowing may be also executed by heat treatment after the material of the light shielding film is embedded.

The material of the light shielding film is securely embedded in the concave portion 9 and inside the groove 11 without a void by burying metallic material which can reflow by CVD as described above and further, executing reflowing and the surface of the acquired film made of the material of the light shielding film is flat enough. Therefore, the light shielding film 12 acquired by applying CMP or etchback to the film and forming the light shielding film 12 securely covers the sides of the upper surface and the side of the transfer electrode 5.

Simultaneously when such a light shielding film 12 is formed, the metallic part of wiring not shown of a manufactured solid-state image sensing device is formed in the same process to simplify the manufacturing process of the solid-state image sensing device.

Figure 1F:
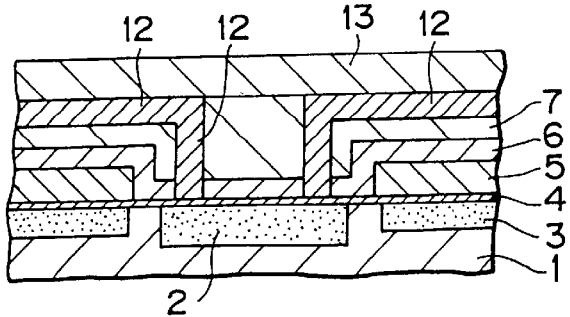

When the light shielding film 12 is formed as described above, a P-SiN film or another film to be a passivation film 13 is formed with the film covering the light shielding film 12 by plasma CVD as heretofore as shown in FIG. 1F. Afterward, if necessary, a planarized film not shown is formed as heretofore, further, a color filter not shown and an on-chip lens not shown are formed on it and a solid-state image sensing device is acquired.

In the above manufacturing method of the solid-state image sensing device, as the concave portion 9 is formed in only the location of the planarized film 7 to be a light shielding area, the groove 11 deep enough to reach the surface of the silicon substrate 1 is formed over the periphery of the light-sensitive sensor part 2 and near the side of the transfer electrode 5 and afterward, the light shielding film 12 is formed by burying the material of the light shielding film in the concave portion 9 and inside the groove 11, the acquired light shielding film 12 has no extended part over the light-sensitive sensor part, hereby, the efficiency of condensing beams to the light-sensitive sensor part can be enhanced, sensitivity can be enhanced and characteristics against a smear can be also enhanced.

As the material made of metallic material which can reflow of the light shielding film is embedded by CVD and further, reflowing is executed, the light shielding film 12 embedded in the concave portion 9 and inside the groove 11 securely covers both sides of the upper surface and the side of the transfer electrode 5 and has no void. Therefore, the light shielding film 12 sufficiently fulfills its function, can securely prevent light from being incident on the transfer electrode 5 and hereby, characteristics against a smear can be enhanced.

Further, as the groove 11 is formed so that it reaches the surface of the silicon substrate 1 and the light shielding film 12 is formed inside the groove 11, incident light can be prevented from reflecting on the surface of the light-sensitive sensor part 2, entering between the surface of the silicon substrate 1 and the lower end of the light shielding film 12 and being incident on the transfer electrode 5 and hereby, characteristics against a smear can be more enhanced.

As the light shielding film 12 is formed by etching for forming the concave portion 9 and the groove 11, burying the material and applying CMP or etchback, the processing of an opening is uniform, the shape and the covering power of the light shielding film 12 can be uniformed and hereby, the minute nonuniformity of sensitivity can be removed.

Particularly, if the planarized film 7 is formed by BPSG or P-SiN by CVD, hydrogenation is accelerated, a dark component can be reduced and hereby, the dark image quality of a picked-up image can be enhanced.

In the embodiment shown in FIGS. 1A to 1F, after the concave portion 9 is formed, the groove 11 is formed in the concave portion 9, however, the present invention is not limited to this, the groove 11 is formed over the periphery of the light-sensitive sensor part 2 and near the side of the transfer electrode 5 beforehand, afterward, only the location to be a light shielding area inside the groove 11 or including the groove is selectively etched and the concave portion 9 may be also formed.

FIGS. 2A to 2F are explanatory drawings for explaining an embodiment of a method of manufacturing a solid-state image sensing device according to the present invention. The manufacturing method shown in FIGS. 2A to 2F is different from the manufacturing method shown in FIGS. 1A to 1F in that the material of the light shielding film is not embedded in the concave portion 9 and the groove 11 at a time after they are formed but a groove is formed, the material of a light shielding film is embedded in the groove, afterward, a concave portion is formed and the material of a light shielding film is embedded in the concave portion.

Figure 2A:
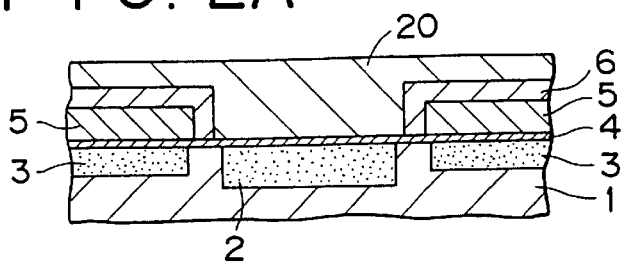
FIGS. 2A to 2F are side sectional views showing the main part for explaining an embodiment of the method of manufacturing the solid-state image sensing device according to the present invention.

That is, also in this embodiment, first, a light-sensitive sensor part 2, a charge transfer part 3, a channel stop not shown and a reading part not shown are formed on the surface of a silicon substrate 1 as shown in FIG. 2A as in the embodiment shown in FIGS. 1A to 1F, an insulating film 4 is formed on the surface of the silicon substrate 1, further, a transfer electrode 5 and an interlayer insulating film 6 are formed on the insulating film 4 and afterward, a first planarized film 20 is formed with it covering the interlayer insulating film 6. As the first planarized film 20, material to be a film provided with sufficient flatness by reflowing is used.

Figure 2B:
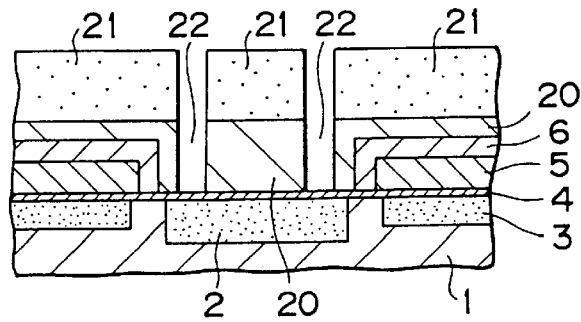
Figure 2C:
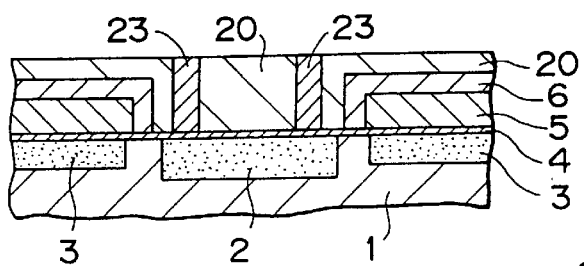

Next, as shown in FIG. 2B, the first planarized film 20 is patterned using a resist pattern 21 as a mask and a groove 22 deep enough to reach the surface of the silicon substrate 1 is formed by etching the first planarized film over the periphery of the light-sensitive sensor part 2 and near the side of the transfer electrode 5. After the resist pattern 21 is removed, the material of a light shielding film is embedded inside the groove 22, further, chemimechanical polishing (CMP) or etchback is applied to the embedded material of the light shielding film, as shown in FIG. 2C, the material of the light shielding film is left only inside the groove 22 and hereby, a first light shielding film 23 is formed.

For the material of the light shielding film, metallic materials which can reflow are suitably used as in the above example. The above material is embedded by CVD excellent in burying and covering power by self-reflowing. If self-reflowing is not enough, heat treatment is applied after the material of the light shielding film is embedded and reflowing may also be executed.

Figure 2D:
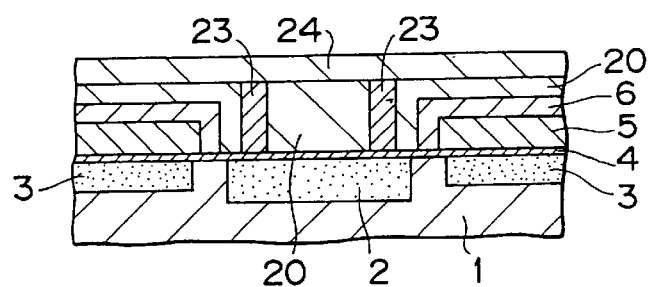

When the first light shielding film 23 is formed as described above, a second planarized film 24 is formed on the first planarized film 20 with the first light shielding film 23 covered as shown in FIG. 2D. As for the second planarized film 24, material to be a film provided with sufficient flatness by reflowing is used as in the case of the first planarized film 20.

Figure 2E:
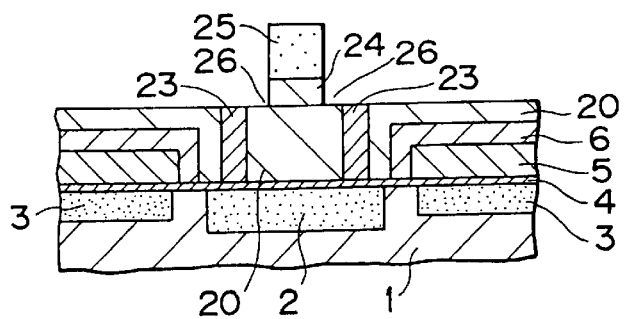

Next, as shown in FIG. 2E, a resist pattern 25 is formed on the second planarized film 24, further, only the location to be a light shielding area for forming a light shielding film is selectively etched using the resist pattern 25 as a mask and a concave portion 26 is formed with the upper surface of the first light shielding film 23 exposed outside. As for the concave portion 26, the resist pattern 25 is patterned so that the position of the inside of the concave portion is a little closer to the side of the center of the light-sensitive sensor part 2 than the position of the first light shielding film 23 on the side of the center of the light-sensitive sensor part 2.

Figure 2F:
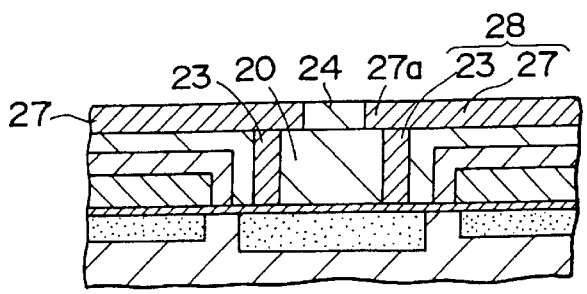

After the resist pattern 25 is removed, the material of a light shielding film is embedded in the concave portion 26, further, chemimechanical polishing (CMP) or etchback is applied to the embedded material of the light shielding film, as shown in FIG. 2F, the material of the light shielding film is left only in the concave portion 26, hereby, a second light shielding film 27 is formed and hereby, a light shielding film 28 composed of the first light shielding film 23 and the second light shielding film 27 can be acquired.

When the light shielding film 28 is formed as described above, the first light shielding film 23 covers the side of the transfer electrode 5, forms a cylinder over the periphery of the light-sensitive sensor part 2, in the meantime, the second light shielding film 27 covers the side of the upper surface of the transfer electrode 5 and the end forms an extended part 27a extended over the light-sensitive sensor part 2.

For the material of the light shielding film used for forming the second light shielding film 27, metallic materials which can reflow are also suitably used as those used for forming the first light shielding film 23. The material is also embedded by CVD and self-reflowing as in the case of the first light shielding film 23. Further, when the first light shielding film 23 or the second light shielding film 27 is formed, a metallic part in the wiring not shown of a manufactured solid-state image sensing device is formed at the same time as either processing, that is, in the same process and a manufacturing process of the solid-state image sensing device is simplified.

When the light shielding film 28 is formed as described above, a passivation film not shown composed of a P-SiN film and others is formed as in the above example, further, a planarized film not shown, a color filter not shown and an on-chip lens not shown are formed on the passivation film in the order and a solid-state image sensing device equivalent to an embodiment of the present invention and disclosed in claim 19 can be obtained.

As the light shielding film 28 is composed of the first light shielding film 23 and the second light shielding film 27 in the solid-state image sensing device obtained as described above, the area of the opening of the light-sensitive sensor part 2 is increased and the efficiency of condensing beams can be enhanced because particularly, the first light shielding film 23 embedded inside the groove 22 forms no protruded part from the surface of the silicon substrate 1. As an extended part 27a extended over the light-sensitive sensor part 2 is provided to the second light shielding film 27, light reflected on the light-sensitive sensor part 2 is reflected on the extended part 27a again, can be incident on the light-sensitive sensor part 2 and hereby, the efficiency of condensing beams can be more enhanced.

Therefore, the sensitivity of the solid-state image sensing device is also enhanced because the efficiency of condensing beams can be enhanced as described above.

In the method of manufacturing the above solid-state image sensing device, as the material of the light shielding film is embedded inside the groove 22 and the first light shielding film 23 is formed, the light shielding film 28 without a protruded part on the side of the surface of the silicon substrate 1 can be formed, hereby, the efficiency of condensing beams in the light-sensitive sensor part 2 is enhanced, the sensitivity can be enhanced and characteristics against a smear can be also enhanced. As the extended part 27a extended over the light-sensitive sensor part 2 is formed in the second light shielding film 27, light reflected on the light-sensitive sensor part 2 is reflected on the extended part 27a again, can be incident on the light-sensitive sensor part 2, hereby, the efficiency of condensing beams is more enhanced and the sensitivity can be enhanced.

Also, in the manufacturing method, as the material of the light shielding film composed of metallic material which can reflow is embedded by CVD and further, reflowing is executed, the light shielding film 28 composed of the first light shielding film 23 and the second light shielding film 27 respectively embedded inside the groove 22 and in the concave portion 26 securely covers the side of the upper surface and the side of the transfer electrode 5 and has no void. Therefore, the light shielding film 28 fulfills its functions sufficiently, can securely prevent light from being incident on the transfer electrode 5 and hereby, characteristics against a smear can be enhanced.

Further, as the groove 22 is formed so that it is deep enough to reach the surface of the silicon substrate 1 and the light shielding film 28 (the first light shielding film 23) is embedded inside the groove 22, incident light reflected on the surface of the light-sensitive sensor part 2 can be prevented from entering between the surface of the silicon substrate 1 and the lower end of the light shielding film 28 and being incident on the transfer electrode 5 and hereby, characteristics against a smear can be more enhanced.

As the first light shielding film 23 and the second light shielding film 27 are formed by etching the groove 22 and the concave portion 26, burying the material of the light shielding film and applying CMP or etchback, the working of an opening is uniform, the shape and the covering power of the light shielding film 28 can be uniformed and hereby, the minute nonuniformity of sensitivity can be removed.

Particularly, if the first planarized film 20 is formed by BPSG or P-SiN by CVD, hydrogenation is accelerated, a dark component can be reduced and hereby, the dark image quality of a picked-up image can be enhanced.

In the embodiment shown in FIGS. 2A to 2F, the extended part 27a is provided to the second light shielding film 27, however, the present invention is not limited to this and the side end face of the second light shielding film and the surface of the first light shielding film 23 on the side of the center of the light-sensitive sensor part 2 may be also approximately aligned.

Figure 3A:
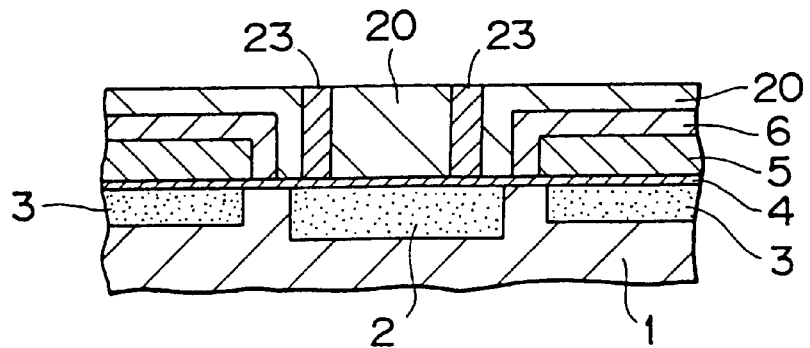
FIGS. 3A to 3C are side sectional views showing the main part for explaining an embodiment of the method of manufacturing the solid-state image sensing device according to the present invention.
Figure 3B:
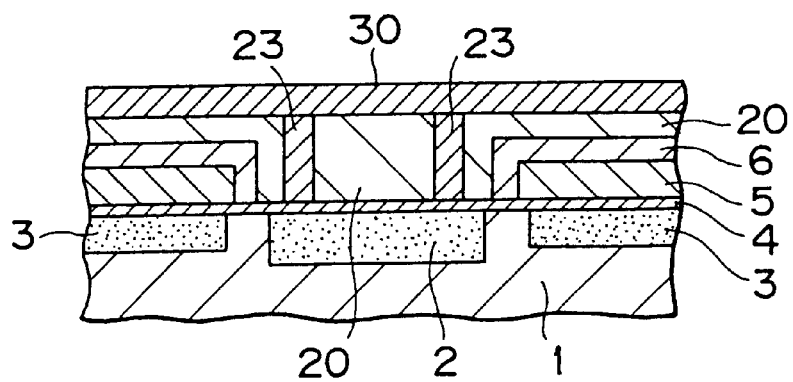
Figure 3C:
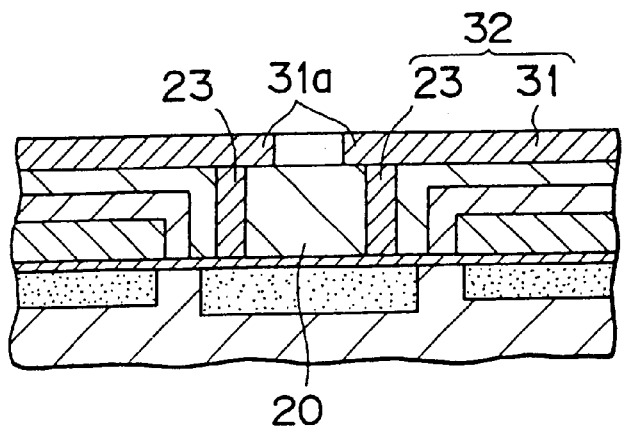

FIGS. 3A to 3C are explanatory drawings for explaining an embodiment of the method of manufacturing the solid-state image sensing device according to the present invention. The manufacturing method shown in FIGS. 3A to 3C is different from the manufacturing method shown in FIGS. 2A to 2F in that a groove is formed, the material of a light shielding film is embedded inside the groove, after a first light shielding film is formed, the material of a light shielding film is deposited again and worked and a second light shielding film is formed.

That is, also in the embodiment, first as shown in FIGS. 2A and 2B, a light-sensitive sensor part 2, a charge transfer part 3, a channel stop not shown and a reading part not shown are formed on the surface of a silicon substrate 1, an insulating film 4 is formed on the surface of the silicon substrate 1, further, a transfer electrode 5 and an interlayer insulating film 6 are formed on the insulating film 4 and afterward, a planarized film 20 for covering the interlayer insulating film 6 is formed. Next, the planarized film 20 is patterned using a resist pattern 21 as a mask and a groove 22 deep enough to reach the surface of the silicon substrate 1 is formed by etching the planarized film over the periphery of the light-sensitive sensor part 2 and near the side of the transfer electrode 5. After the resist pattern 21 is removed, the material of a light shielding film is embedded inside the groove 22, further, chemimechanical polishing (CMP) or etchback is applied to the embedded material of the light shielding film, as shown in FIG. 3A, the material of the light shielding film is left only inside the groove 22 and hereby, a first light shielding film 23 is formed.

When the first light shielding film 23 is formed as described above, a light shielding film is formed on the whole surface with the above light shielding film connected to the first light shielding film 23 embedded inside the groove 22 as shown in FIG. 3B and a light shielding layer 30 is formed. Next, a resist pattern not shown is formed by well-known resist technique and lithography. Next, the light shielding layer 30 is patterned using the resist pattern as a mask and a second light shielding film 31 a part of which surrounded by the upper end of the first light shielding film 23 is open as shown in FIG. 3C is formed. Hereby, a light shielding film 32 composed of the first light shielding film 23 and the second light shielding film 31 can be obtained.

When the light shielding film 31 is formed as described above, the first light shielding film 23 covers the side of the transfer electrode 5, forms a cylinder over the periphery of the light-sensitive sensor part 2, in the meantime, the second light shielding film 31 covers the side of the upper surface of the transfer electrode 5 and the end forms an extended part 31a extended over the light-sensitive sensor part 2 respectively as in the above example shown in FIGS. 2A to 2F.

After the above light shielding film 32 is formed, the resist pattern not shown is removed, further, a passivation film not shown composed of P-SiN and others is formed as in the above example, a planarized film not shown, a color filter not shown and an on-chip lens not shown are formed on the passivation film in the order and a solid-state image sensing device equivalent to another embodiment according to the present invention.

As the light shielding film 32 is also composed of the first light shielding film 23 and the second light shielding film 31 in the solid-state image sensing device obtained as described above, the area of the opening of the light-sensitive sensor part 2 is increased and the efficiency of condensing beams can be enhanced particularly because the first light shielding film 23 embedded inside the groove 22 forms no protruded part on the side of the surface of the silicon substrate 1. As an extended part 31a extended over the light-sensitive sensor part 2 is provided to the second light shielding film 31, light reflected on the light-sensitive sensor part 2 is reflected on the extended part 31a again, can be incident on the light-sensitive sensor part 2 and hereby, the efficiency of condensing beams can be more enhanced. Therefore, as the efficiency of condensing beams can be enhanced as described above, the sensitivity of the solid-state image sensing device is enhanced.

In the above method of manufacturing the solid-state image sensing device, the similar effect to that in the above example can be also obtained. For example, the light shielding film 28 without a protruded part on the side of the surface of the silicon substrate 1 can be formed by burying the material of the light shielding film inside the groove 22 and forming the first light shielding film 23, hereby, the efficiency of condensing beams in the light-sensitive sensor part 2 is enhanced, the sensitivity can be enhanced and characteristics against a smear can be also enhanced. As the extended part 31a extended over the light-sensitive sensor part 2 is formed in the second light shielding film 31, light reflected on the light-sensitive sensor part 2 is reflected on the extended part again, can be incident on the light-sensitive sensor part 2, hereby, the efficiency of condensing beams is more enhanced and the sensitivity can be enhanced.

In the embodiment shown in FIGS. 3A to 3C, the extended part 31a is also provided to the second light shielding film 31, the present invention is not limited to this and the side end face of the second light shielding film and the surface of the first light shielding film 23 on the side of the center of the light-sensitive sensor part 2 may be also approximately aligned.

As described above, as the method of manufacturing the solid-state image sensing device according to the present invention and disclosed in claim 1 is a method in which the concave portion is formed only in the location of the planarized film to be a light shielding area, the groove deep enough to reach the vicinity of the surface of the substrate is formed over the periphery of the light-sensitive sensor part and near the side of the transfer electrode and afterward, the light shielding film is formed by burying the material of the light shielding film in the concave portion and inside the groove, the obtained light shielding film has no extended part over the light-sensitive sensor part, hereby, the efficiency of condensing beams in the light-sensitive sensor part can be enhanced, therefore, the sensitivity can be enhanced and characteristics against a smear can be also enhanced. Therefore, the miniaturization of the solid-state image sensing device and the densification of a picture element can be accelerated and hereby, the above method is a suitable method for manufacturing a small-sized high definition video camera for a private purpose.

As in the method of manufacturing the solid-state image sensing device shown in FIGS. 2A to 2F and the method of manufacturing the solid-state image sensing device shown in FIGS. 3A to 3C the first light shielding film is formed by burying the material of the light shielding film inside the groove, the light shielding film without a protruded part on the side of the surface of the substrate can be formed, hereby, the efficiency of condensing beams in the light-sensitive sensor part is enhanced, the sensitivity can be enhanced and characteristics against a smear can be also enhanced.

As in the solid-state image sensing device the light shielding film is composed of the first light shielding film and the second light shielding film and particularly, the first light shielding film embedded inside the groove forms no protruded part on the side of the surface of the substrate, the area of the opening of the light-sensitive sensor part is increased and the efficiency of condensing beams is enhanced. As the extended part extended over the light-sensitive sensor part is provided to the second light shielding film, light reflected on the light-sensitive sensor part is reflected on the extended part again, is incident on the light-sensitive sensor part and hereby, the efficiency of condensing beams is more enchanced. Therefore, as the efficiency of condensing beams is enhanced as described above, the sensitivity of the solid-state image sensing device is enhanced and hereby, the solid-state image sensing device enables the miniaturization and the densification of a picture element.

What is claimed is:

1. A method of manufacturing a solid-state image sensing device in which a light-sensitive sensor part for photoelectric transfer is formed on the surface of a substrate and a light shielding film for preventing light from being incident on the substrate except said light-sensitive sensor part is formed, comprising:

a process for forming a transfer electrode on the substrate via an insulating film and a planarized film for covering an interlayer insulating film after the interlayer insulating film for covering said transfer electrode is further formed;

a process for selectively etching only the location of said planarized film to be a light shielding area for forming said light shielding film and forming a concave portion;

a process for etching said planarized film over the periphery of said light-sensitive sensor part and near the side of said transfer electrode and forming a groove deep enough to reach the vicinity of the surface of said substrate; and a process for burying the material of a light shielding film in said concave portion and inside said groove and forming a light shielding film.

2. A method of manufacturing a solid-state image sensing device according to claim 1, wherein:

said process for burying the material of the light shielding film in said concave portion and inside said groove and forming the light shielding film is a process for selectively removing the material of the light shielding film on a light receiving area over said light-sensitive sensor part by polishing or etchback after the material of the light shielding film is embedded in the concave portion and inside the groove and forming a light shielding film.

3. A method of manufacturing a solid-state image sensing device according to claim 1, wherein:

for the material of said light shielding film, material which can reflow is used; and when the material of said light shielding film is embedded and a light shielding film is formed, the light shielding film is formed by self-reflowing or heat treatment is applied afterward.

4. A method of manufacturing a solid-state image sensing device according to claim 1, wherein:

said insulating film is formed including at least a silicon nitride film; and said planarized film is composed of a silicon oxide film.

5. A method of manufacturing a solid-state image sensing device according to claim 1, wherein:

said light shielding film is formed by burying the material of the light shielding film by CVD.

6. A method of manufacturing a solid-state image sensing device according to claim 1, wherein:

for the material of the light shielding film, metallic materials are used; and the light shielding film and a metallic part in the wiring of a solid-state image sensing device are simultaneously formed.

* * * * *